(12) United States Patent
Yin et al.

(10) Patent No.: US 8,837,137 B2
(45) Date of Patent: Sep. 16, 2014

(54) ELECTRONIC DEVICE HAVING ACCESSIABLE TRAY

(75) Inventors: Xiu-Zhong Yin, Shenzhen (CN);
 Xiu-Quan Hu, Shenzhen (CN); Yu-Wei He, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 217 days.

(21) Appl. No.: 13/535,280

(22) Filed: Jun. 27, 2012

(65) Prior Publication Data
 US 2013/0100593 A1 Apr. 25, 2013

(30) Foreign Application Priority Data
 Oct. 24, 2011 (CN) .......................... 2011 1 0325629

(51) Int. Cl.
 *G06F 1/16* (2006.01)
(52) U.S. Cl.
 USPC ................ 361/679.33; 248/309.1; 360/264.2; 455/575.1
(58) Field of Classification Search
 CPC ........................................................ G06F 1/00
 USPC .......... 312/223.1, 223.2, 223.3, 319.2, 332.1, 312/330.1, 257.1; 361/679.31, 679.32, 361/679.33, 679.34, 679.35, 679.37, 361/679.38, 679.4, 679.43, 679.47, 679.54, 361/679.21, 679.26, 679.16, 679.09, 361/679.55, 679.59, 679.02, 679.56, 361/679.39; 360/99.08, 235.4, 128, 97.14, 360/97.22, 97.16, 245.8, 254, 264.2, 90.2; 165/80.2, 104.26, 104.14, 104.33, 165/80.3, 61; 345/173, 174, 204, 55, 690, 345/419, 32, 168, 652, 520, 170, 107; 455/556.1, 566, 179.1, 2.01, 575.1, 455/550.1; 248/221.11, 636, 224.8, 220.21, 248/309.1, 314, 220.22, 205.1, 276.1, 248/122.1, 558, 181.1, 310
 See application file for complete search history.

(56) References Cited

U.S. PATENT DOCUMENTS

| | | | |
|---|---|---|---|
| 7,365,969 B2* | 4/2008 | Chung | 361/679.55 |
| 2005/0007734 A1* | 1/2005 | Peng et al. | 361/685 |
| 2005/0024819 A1* | 2/2005 | Peng et al. | 361/685 |

* cited by examiner

*Primary Examiner* — Hung Duong
(74) *Attorney, Agent, or Firm* — Novak Druce Connolly Bove + Quigg LLP

(57) ABSTRACT

An electronic device includes a chassis and a tray installed in the chassis. The tray includes a base plate which defines an opening. A limiting standoff protrudes from an inner surface of the chassis and extends through the opening of the base plate. A locking module includes a pivotable member pivotally attached to the base plate which rotates about an axis perpendicular to the base plate. When the pivotable member is rotated to a first position, the limiting standoff locks the pivotable member to prevent the tray from sliding out from the chassis. When the pivotable member is rotated to a second position, the limiting standoff unlocks the pivotable member to allow the tray sliding out from the chassis.

20 Claims, 5 Drawing Sheets

ELECTRONIC DEVICE HAVING ACCESSIABLE TRAY

BACKGROUND

1. Technical Field

The present disclosure relates to electronic devices, and particularly to an electronic device configured with a tray.

2. Description of Related Art

Electronic devices, such as blade servers, are oftentimes configured with multiple trays for housing hardware components, such as system boards and storage devices. Users can replace hardware components in the trays or add new hardware components into the trays by accessing the trays. However, the trays are oftentimes fixed firmly in the chassis by securing means such as screws, such securing means may be difficult for the users to access the trays without extra tools and/or special equipment.

With the above described disadvantages in view, there is a need to provide an electronic device which allows the user to access the trays much more easily.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one".

Figure 1:
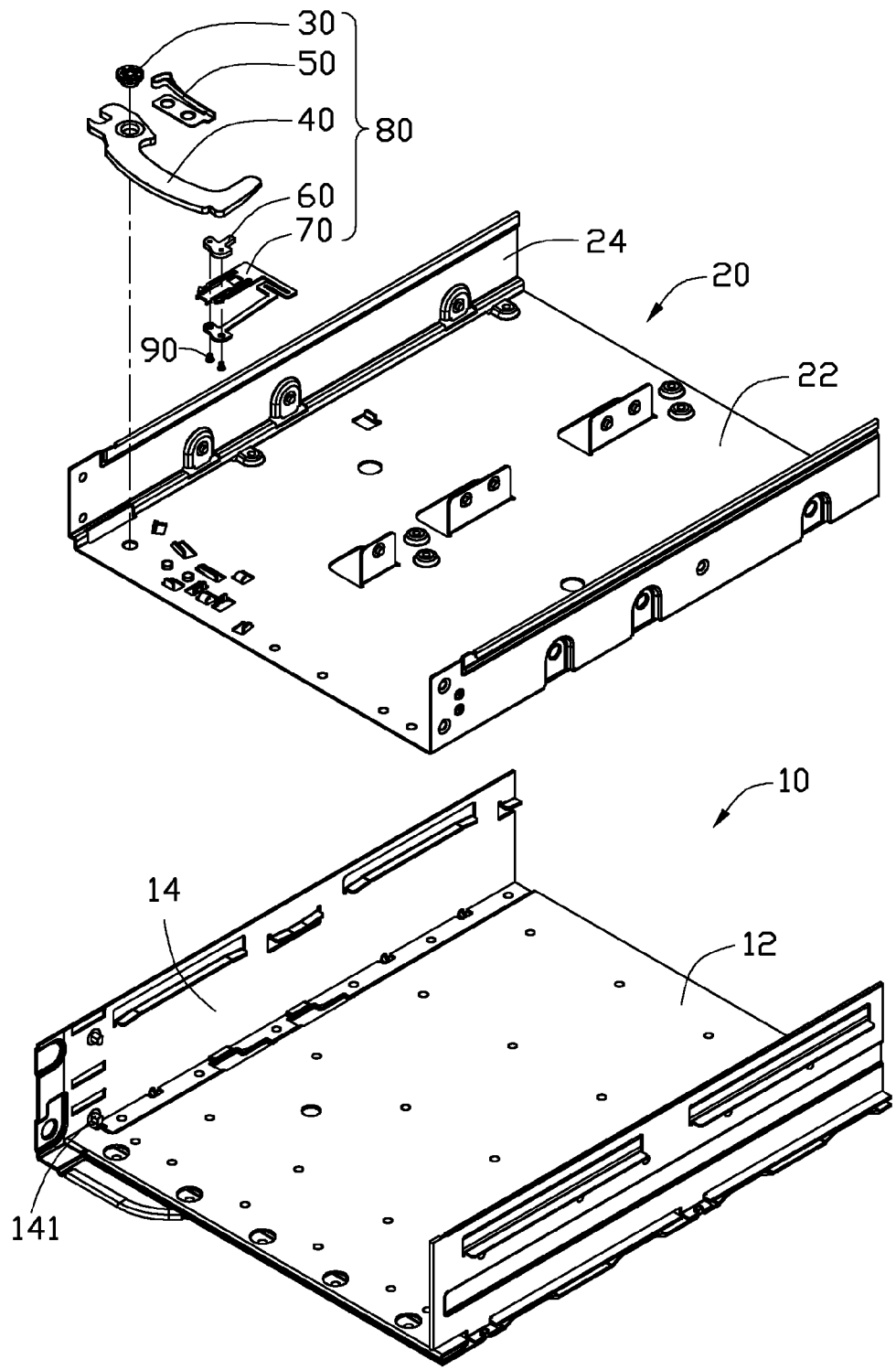
FIG. 1 is an exploded, isometric view of an electronic device in accordance with an embodiment.

Referring to FIG. 1, an electronic device in accordance with an embodiment is shown. The electronic device includes a chassis 10, a tray 20, and a locking module 80. The chassis 10 includes a base plate 12 and two side plates 14. The two side plates 14 are perpendicular to the base plate 12 and connected to two opposite sides of the base plate 12. At least one limiting standoff 141 protrudes from an inner surface of each of the two side plates 14. The limiting standoff 141 is adjacent to the base plate 12 and adjacent to a front side edge of the side plate 14.

Figure 2:
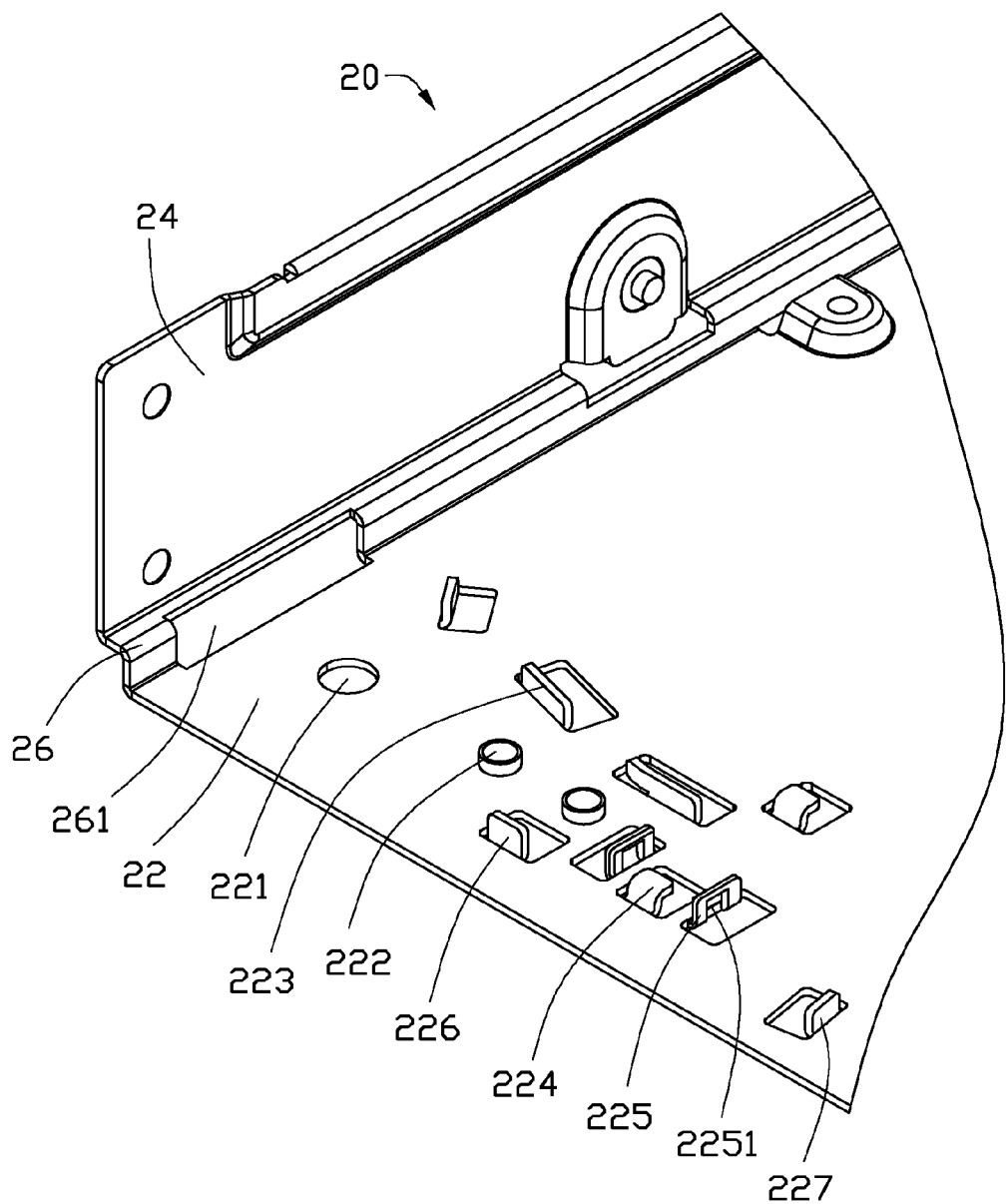
FIG. 2 is a partially enlarged view of a tray of FIG. 1.

Referring to FIG. 2, the tray 20 includes a base plate 22 and two side plates 24. The two side plates 24 are perpendicular to the base plate 22. The distance between the two side plates 24 of the tray 20 is substantially the same as the distance between the two side plates 14 of the chassis 10. An L-shaped connecting border 26 interconnects the base plate 22 and each of the two side plates 24. An opening 261 is defined at the front side of the connecting border 26. A securing hole 221 is defined in the base plate 22 of the tray 20. Two securing posts 222 protrude upwardly from the base plate 22 of the tray 20. The securing hole 221 is located between the opening 261 and the two securing posts 222. The securing hole 221 and the two securing posts 222 are arranged in a line perpendicular to the side plate 24. Two blocking pieces 223 are punched out of the base plate 22. The two blocking pieces are located behind the two securing posts 222. One of the two blocking pieces 223 is perpendicular to the side plate 24 and the other one of the blocking pieces 223 is slanted to the side plate 24. Two L-shaped hook pieces 224 obliquely extend from the base plate 22. The two hook pieces 224 are arranged in a line parallel to the side plate 24 and have the same orientation. Two buckling pieces 225, a first limiting piece 226, and a second limiting piece 227 are also punched out of the base plate 22. The two buckling pieces 225 are located at two opposite sides of an anterior one of the two hook pieces 224. Each of the two buckling pieces 225 defines an opening 2251. The first limiting piece 226 is located in front of the right securing post 222 and perpendicular to the side plate 24. The second limiting piece 227 is located at the front right side of the right buckling piece 225 and is perpendicular to the first limiting piece 226.

Figure 3:
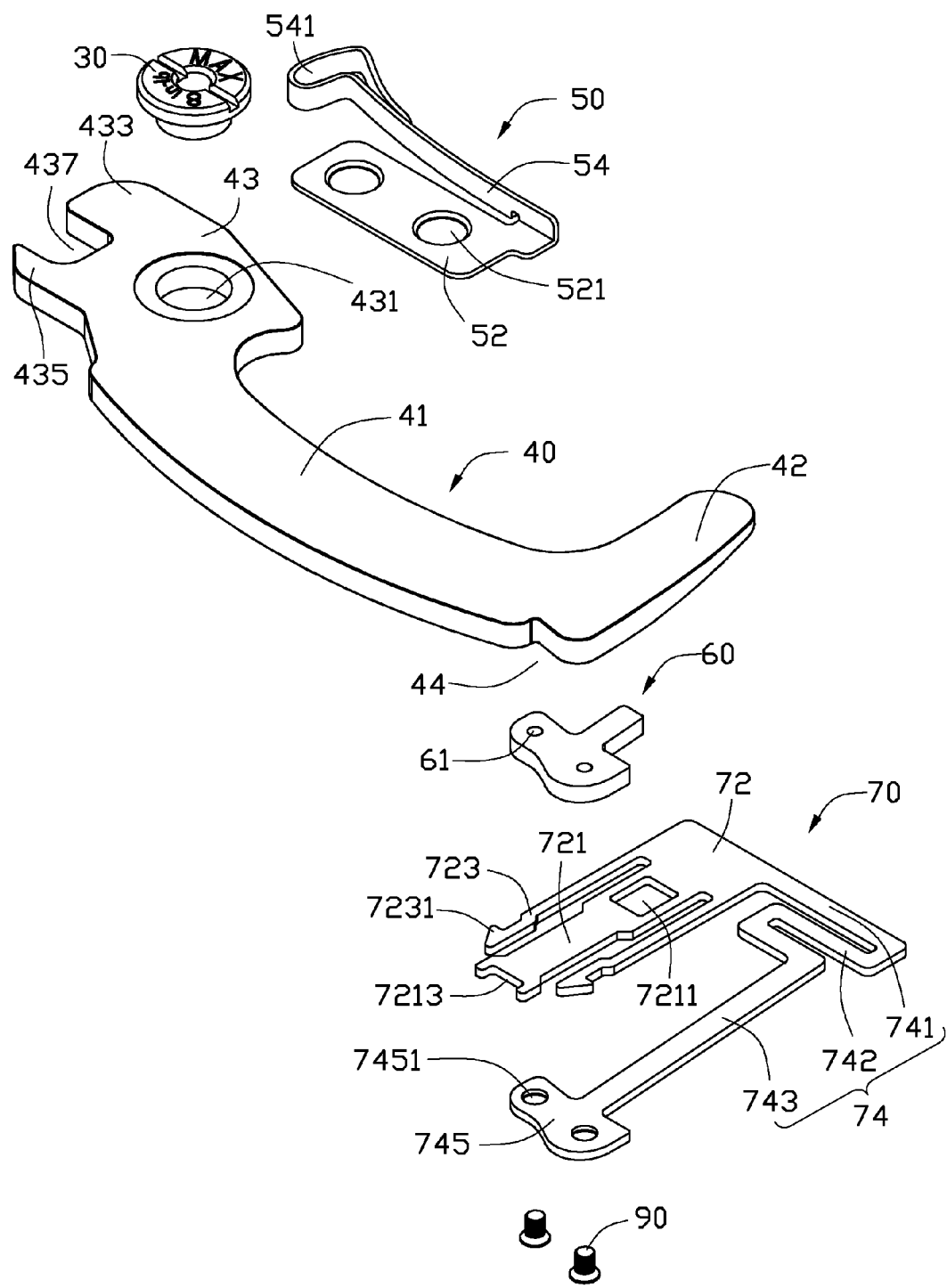
FIG. 3 is an enlarged view of a locking module of FIG. 1.

Referring to FIG. 3, the locking module 80 includes a securing member 30, a pivotable member 40, a driving member 50, a resisting member 60, and a resilient member 70. The pivotable member 40 includes a horizontal main body 41, an extending portion 42, and a securing portion 43. The extending portion 42 extends laterally from one end of the main body 41 and the securing portion 43 extends from the other end of the main body 41. The securing portion 43 defines a securing hole 431. The securing portion 43 includes a first resisting tab 433 and a second resisting tab 435. A U-shaped cutout 437 is defined between the first resisting tab 433 and the second resisting tab 435. An L-shaped cutout 44 is defined at the exterior side of the joint portion of the main body 41 and the extending portion 42.

The driving member 50 includes a securing piece 52 and a resilient arm 54. The resilient arm 54 extends from the securing piece 52. Two mounting holes 521 are defined in a securing post 222 responding to the securing piece 52. The securing piece 52 is rectangular. The resilient arm 54 extends from a corner of the securing piece 52. A resisting portion 541 is located on a free distal end of the resilient arm 54. The resisting portion 541 forms a loop. The driving member 50 is made from resilient materials and is elastically deformable.

The resilient member 70 includes a main body 72 and a resilient lever 74. The resilient lever 74 extends from the main body 72. The main body 72 includes a mounting piece 721 and two securing arms 723. The two securing arms 723 are arranged at two opposite sides of the mounting piece 721. The two securing arms 723 are symmetrical. A gap is defined between the mounting piece 721 and each of the two securing arms 723. The mounting piece 721 defines a securing opening 7211 and a cutout 7213. The cutout 7213 is defined at an end of the mounting piece 721. The cutout 7213 is U-shaped. The width of the cutout 7213 and the width of the securing opening 7211 are substantially equal to the width of the hook piece 224. A hook portion 7231 protrudes outwardly from an end of each of the two securing arms 723. The hook portion 7231 extends through the opening 2251 of the buckling piece 225 of the tray 20. The resilient lever 74 includes a horizontal shaft 741, a connecting shaft 742, and an acting shaft 743. The horizontal shaft 741 extends laterally from a corner of the main body 72. The connecting shaft 742 extends from the horizontal shaft 741 and is connected to the acting shaft 743. The connecting shaft 742 includes an L-shaped bent portion which enhances the resilience of the connecting shaft 742.

The acting shaft 743 is perpendicular to the horizontal shaft 741. A resisting piece 745 protrudes from a free end of the acting shaft 743. The resisting piece 745 defines two mounting holes 7451. The resisting member 60 defines two mounting holes 61 corresponding to the two mounting holes 7451 of the resisting piece 745. Two mounting members 90 are inserted into the two mounting holes 7451 of the resisting piece 745 and the two mounting holes 61 of the resisting member 60, thereby mounting the resisting member 60 to the resisting piece 745. The thickness of the resisting member 60 and the thickness of the resisting piece 745 are substantially equal to the thickness of the pivotable member 40.

Figure 4:
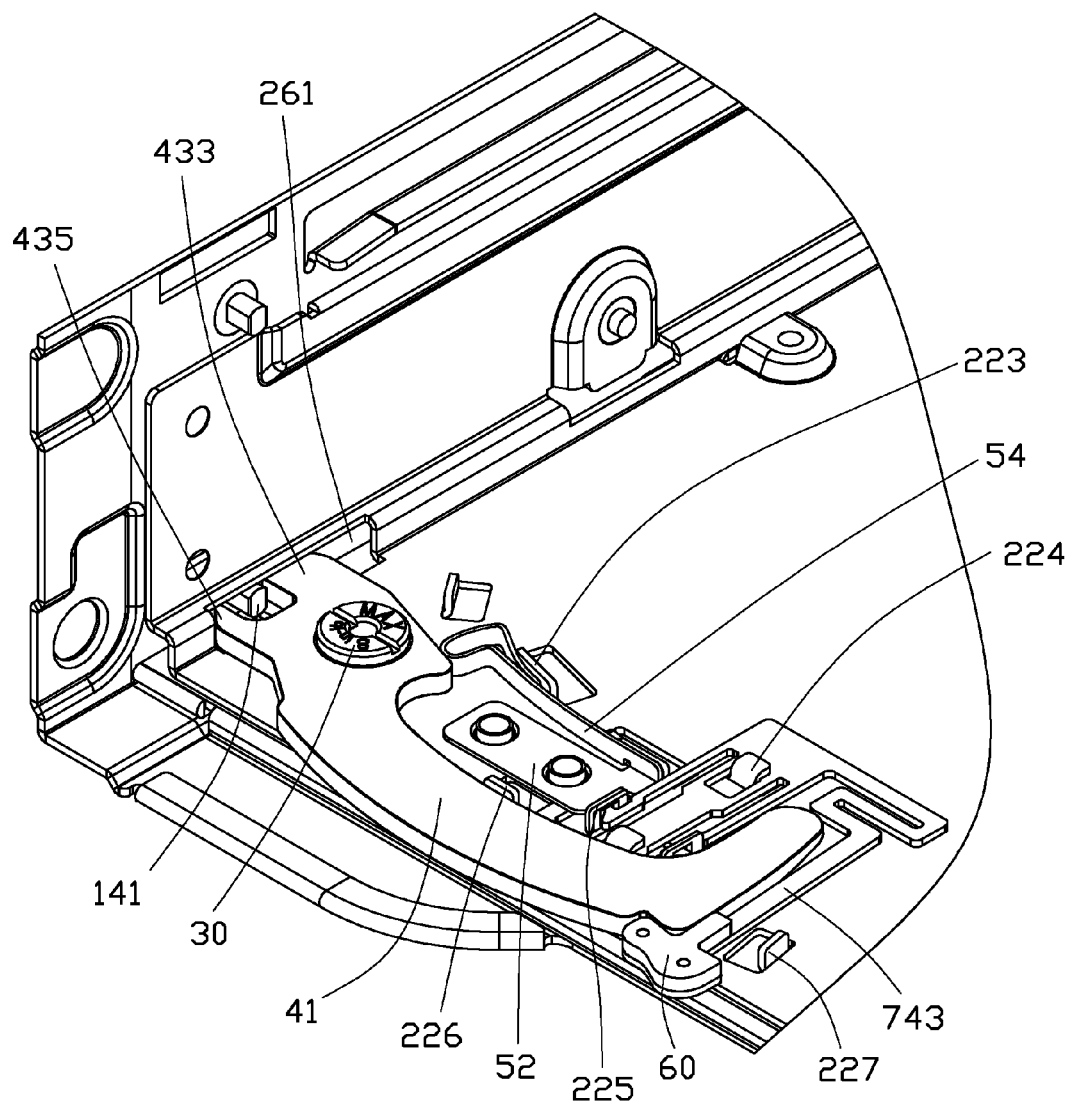
FIG. 4 is an assembled view of the electronic device of FIG. 1.
Figure 5:
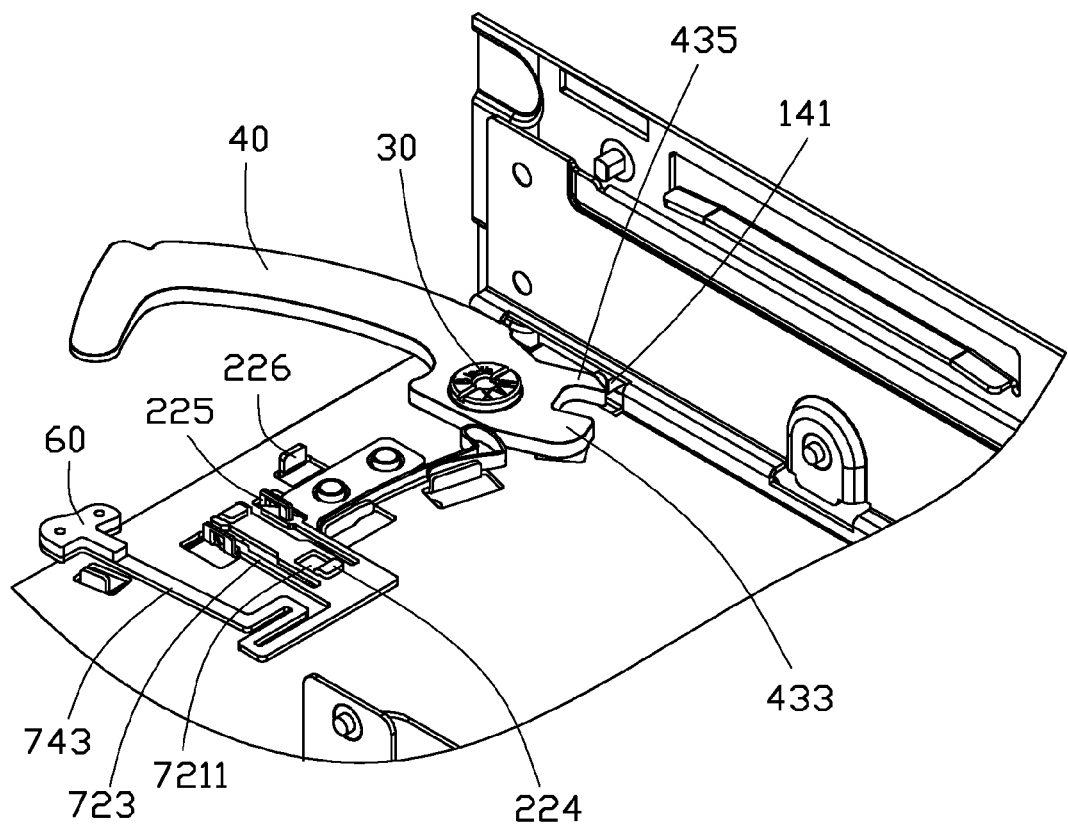
FIG. 5 is similar to FIG. 4, but viewed from a different aspect, showing the tray in an unlocked position.

Referring to FIGS. 4 and 5, in assembly, the tray 20 is slid along the base plate 12 of the chassis 10 and is moved into the chassis 10. The two side plates 24 of the tray 20 contact the inner surfaces of the two side plates 14 of the chassis 10. The limiting standoff 141 of the chassis 10 is inserted into the opening 261 of the tray 20. The securing hole 431 of the pivotable member 40 is aligned with the securing hole 221 of the tray 20. The securing member 30 is inserted into the securing hole 431 of the pivotable member 40 and the securing hole 221 of the tray 20, thereby mounting the pivotable member 40 to the base plate 22 of the tray 20. The securing post 222 of the tray 20 is aligned with and inserted into the mounting hole 521 of the driving member 50. The driving member 50 is mounted to the base plate 22 of the tray 20 by riveting or other means. The resisting member 60 is secured to the resisting piece 745 of the resilient member 70 by the mounting member 90. The rear one of the buckling pieces 224 is received in the securing opening 7211 of the resilient member 70. The resilient member 70 is moved forward until the rear one of the two buckling pieces 224 is engaged with the securing opening 7211 and the anterior one of the two buckling pieces 224 is engaged with the cutout 7213 of the resilient member 70. The hook portions 7231 of the two securing arms 723 are engaged with the openings 2251 of the two buckling pieces 225. The resilient member 70 is secured to the base plate 22 of the tray 20. Thus, the locking module 80 is secured to the base plate 22 of the tray 20.

When the locking module 80 is in a locked position as shown in FIG. 4, the first resisting tab 433 and the second resisting tab 435 are inserted into the opening 261 of the tray 20. The limiting standoff 141 of the chassis 10 is received in the cutout 437 of the pivotable member 40 and abuts the front side edge of the first resisting tab 433. The extending portion 42 of the pivotable member 40 is located between the main body 72 of the resilient member 70 and the resilient lever 74. The resisting piece 745 of the resilient member 74 and the resisting member 60 are engaged with the cutout 44 of the pivotable member 40, thereby preventing the pivotable member from rotating clockwise. The first limiting piece 226 abuts the interior side of the main body 41 of the pivotable member 40, thereby preventing the pivotable member from rotating anticlockwise. The securing portion 43 of the pivotable member 40 abuts the resisting portion 541 of the driving member 50. The resilient arm 54 of the driving member 50 is elastically deformed and moved backwards. The resilient arm 54 of the driving member 50 abuts the two blocking pieces 223 of the tray 20. Thus, the limiting standoff 141 of the chassis 10 prevents the first resisting tab of the pivotable member 40 from moving forward, thereby preventing the tray 20 from moving out of the chassis 10.

Referring to FIG. 5, when pulling the tray 20 out of the chassis 10, the resisting member 60 is biased to the right and the acting shaft 743 of the resilient lever 74 of the resilient member 70 is deformed to the right. The pivotable member 40 is disengaged from the resisting member 60 and the resisting piece 745. The resilient arm 54 of the driving member 50 recovers and allows the pivotable member 40 to rotate clockwise. The first resisting tab 433 of the pivotable member 40 is rotated to a position in which the first resisting tab 433 does not interfere with the limiting standoff 141. Then, the tray 20 is able to be pulled out of the chassis 10.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. An electronic device, comprising:
a chassis;
a tray installed in the chassis, the tray comprising a base plate, the base plate defining an opening;
a limiting standoff protruding from the chassis and extending through the opening of the base plate; and
a locking module comprising a pivot member pivotally attached to the base plate, the pivot member being adapted to rotate about an axis that is substantially perpendicular to the base plate;
wherein the limiting standoff is engaged with the pivot member to prevent the tray from sliding out of the chassis when the pivot member is in a first position, and the pivot member is disengaged from the limiting standoff to allow the tray sliding out of the chassis when the pivot member is in a second position.

2. The electronic device of claim 1, wherein the locking module comprises a resilient member secured to the base plate, the resilient member comprises a resilient lever, a resisting piece protrudes from an end of the resilient lever, the resisting piece abuts against the pivotable member in the first position.

3. The electronic device of claim 2, wherein the resilient member comprises a first main body secured to the base plate, and the resilient lever extends from the first main body.

4. The electronic device of claim 3, wherein the resilient lever comprises a horizontal shaft extending laterally from a corner of the first main body, a connecting shaft extending from the horizontal shaft, and an acting shaft extending from the connecting shaft; the horizontal shaft is perpendicular to the acting shaft; and the connecting shaft comprises an L-shaped bent portion.

5. The electronic device of claim 4, wherein the resisting piece protrudes from an end of the acting shaft, the locking module comprises a resisting member secured to the resisting piece, and a thickness of the resisting member and a thickness of the resisting piece are substantially equal to a thickness of the pivotable member.

6. The electronic device of claim 2, wherein the locking module comprises a driving member secured to the base plate of the tray; when the pivotable member is rotated to the first position, the pivotable member abuts the driving member and elastically deforms the driving member; when the pivotable member is disengaged from the resilient member, the driving member elastically rebounds and drives the pivotable member to rotate to the second position.

7. The electronic device of claim 6, wherein the driving member comprises a securing piece secured to the base plate of the tray and a resilient arm extending from the securing piece, and the resilient arm is bent to form a resisting portion abutting the pivotable member.

8. The electronic device of claim 3, wherein the pivotable member comprises a second main body, a extending portion extending laterally from one end of the second main body, a securing portion extending from another end of the second main body, a cutout is defined in an exterior side of a joint portion of the second main body and the extending portion, and the resisting piece of the resilient member is engaged within the cutout.

9. The electronic device of claim 8, wherein the securing portion of the pivotable member defines a first securing hole, the base plate of the tray defines a second securing hole, and a securing member is inserted into the first securing hole and the second securing hole thereby mounting the pivotable member to the base plate.

10. The electronic device of claim 8, wherein the securing portion of the pivotable member comprises a first resisting tab and a second resisting tab, the securing portion defines a U-shaped cutout between the first resisting tab and the second resisting tab, the limiting standoff abuts the first resisting tab thereby preventing the tray from sliding out of the chassis when the pivotable member is in the first position.

11. An electronic device, comprising:
a chassis comprising a first base plate and a first side plate;
a tray installed in the chassis, the tray comprises a second base plate and a second side plate, the tray defining an opening between the second base plate and the second side plate;
a limiting standoff protruding from an interior side of the first side plate and extending through the opening of the tray; and
a locking module comprising a pivotable member pivotally attached to the second base plate, the pivotable member is adapted to rotate about an axis that is substantially perpendicular to the second base plate;
wherein the limiting standoff is engaged with the pivotable member to prevent the tray from sliding out of the chassis when the pivotable member is in a first position, and the pivotable member is disengaged from the limiting standoff to allow the tray sliding out of the chassis when the pivotable member is in a second position.

12. The electronic device of claim 11, wherein the locking module comprises a resilient member secured to the second base plate, the resilient member comprises a resilient lever, a resisting piece protrudes from an end of the resilient lever, the resisting piece abuts against the pivotable member in the first position.

13. The electronic device of claim 12, wherein the resilient member comprises a first main body secured to the second base plate, and the resilient lever extends from the first main body.

14. The electronic device of claim 13, wherein the resilient lever comprises a horizontal shaft extending laterally from a corner of the first main body, a connecting shaft extending from the horizontal shaft, and an acting shaft extending from the connecting shaft, the horizontal shaft is perpendicular to the acting shaft, and the connecting shaft comprises an L-shaped bent portion.

15. The electronic device of claim 14, wherein the resisting piece protrudes from an end of the acting shaft, the locking module comprises a resisting member secured to the resisting piece, and a thickness of the resisting member and a thickness of the resisting piece are substantially equal to a thickness of the pivotable member.

16. The electronic device of claim 12, wherein the locking module comprises a driving member secured to the second base plate; when the pivotable member is rotated to the first position, the pivotable member abuts the driving member and elastically deforms the driving member; when the pivotable member is disengaged from the resilient member, and the driving member elastically rebounds and drives the pivotable member to rotate to the second position.

17. The electronic device of claim 16, wherein the driving member comprises a securing piece secured to the second base plate and a resilient arm extending from the securing piece, and the resilient arm is bent to form a resisting portion abutting the pivotable member.

18. The electronic device of claim 13, wherein the pivotable member comprises a second main body, a extending portion extending laterally from one end of the second main body, a securing portion extending from another end of the second main body, a cutout is defined at an exterior side of a joint portion of the second main body and the extending portion, and the resisting piece of the resilient member is engaged within the cutout.

19. The electronic device of claim 18, wherein the securing portion of the pivotable member defines a first securing hole, the second base plate defines a second securing hole, and a securing member is inserted into the first securing hole and the second securing hole thereby mounting the pivotable member to the second base plate.

20. The electronic device of claim 18, wherein the securing portion of the pivotable member comprises a first resisting tab and a second resisting tab, the securing portion defines a U-shaped cutout between the first resisting tab and the second resisting tab, the limiting standoff abuts the first resisting tab thereby preventing the tray from sliding out of the chassis when the pivotable member is in the first position.

* * * * *